(12) United States Patent
Kim

(10) Patent No.: US 7,396,723 B2
(45) Date of Patent: Jul. 8, 2008

(54) METHOD OF MANUFACTURING EEPROM DEVICE

(75) Inventor: Dong-Oog Kim, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 15 days.

(21) Appl. No.: 11/613,801

(22) Filed: Dec. 20, 2006

(65) Prior Publication Data
US 2007/0148866 A1 Jun. 28, 2007

(30) Foreign Application Priority Data
Dec. 26, 2005 (KR) .................. 10-2005-0129654

(51) Int. Cl.
*H01L 21/336* (2006.01)
*H01L 21/469* (2006.01)
*H01L 21/31* (2006.01)

(52) U.S. Cl. .................. 438/257; 438/258; 438/761; 438/763; 438/261; 438/149; 438/366; 257/499; 257/E21.645; 257/E21.68

(58) Field of Classification Search .................. 438/257, 438/761, 763, 258, 261, 149, 366; 257/499, 257/E21.68, E21.645
See application file for complete search history.

(56) References Cited

U.S. PATENT DOCUMENTS 6,326,316 B1 * 12/2001 Kiyotoshi et al. .......... 438/763
6,359,305 B1 * 3/2002 Chiu ........................ 257/316
7,064,378 B2 * 6/2006 Jeon et al. .................. 257/315

* cited by examiner

*Primary Examiner*—Michael S. Lebentritt
*Assistant Examiner*—Mohsen Ahmadi
(74) *Attorney, Agent, or Firm*—Sherr & Nourse, PLLC

(57) ABSTRACT

A method of manufacturing an EEPROM device can reduce the cell area. The method of manufacturing an Electrically Erasable Programmable Read-Only Memory (EEPROM) includes forming a mask pattern over a semiconductor substrate; forming a gate oxide layer over a top of the semiconductor substrate exposed through the mask pattern; forming access gates which are self-aligned with both side walls of the mask pattern, over a top of the gate oxide layer; removing the mask pattern; forming first dielectric spacers to be attached to side walls of the access gates; forming an insulating layer adapted to cover the access gates and the first dielectric spacers; and forming two cell gates, which are self-aligned with opposite side walls of the two access gates, respectively, each first dielectric spacer being interposed between a corresponding cell gate and a corresponding access gate, the cell gates separately arranged over a top of the insulating layer.

8 Claims, 4 Drawing Sheets

METHOD OF MANUFACTURING EEPROM DEVICE

The present application claims priority under 35 U.S.C. 119 and 35 U.S.C. 365 to Korean Patent Application No. 10-20050129654 (filed on Dec. 26, 2005), which is hereby incorporated by reference in its entirety.

BACKGROUND

Recently, Silicon Oxide Nitride Oxide Silicon (SONOS) devices have been recognized as important non-volatile memory devices. In particular, a SONOS flash memory cell based on two transistors (Tr) is a stable flash memory device due to its effective prevention of over-erases. In spite of this advantage, a two transistor SONOS flash memory has the disadvantage of a relatively large cell size, which undermines miniaturization.

FIG. 1 is a sectional view schematically showing an EEPROM device.

Referring to FIG. 1, after an isolation region is formed in a semiconductor substrate 10, a well process, a photo process and an ion implantation process for adjusting the threshold voltage $V_{th}$ of a cell are performed. Thereafter, an Oxide-Nitride-Oxide (ONO) layer 20 composed of oxide layer 21, nitride layer 23, and oxide layer 25 is formed over the semiconductor substrate 10. Next, a photo process and an etching process for patterning the ONO layer 20 are performed. Subsequently, an oxidation process for forming a gate oxide layer 30 is performed.

The gate layer is formed and is patterned using a photo process and an etching process to form a first gate 41 and a second gate 42. Next, a dopant ion implantation process for forming junctions 50, such as source/drain junctions 51 and an intermediate transfer node junction 53, is performed.

Thereafter, a dielectric layer 60 and a contact 65 penetrating through the dielectric layer 60 are formed, and a bit line 70 may be formed.

However, such a cell structure based on two transistors is accompanied by an increase in the cell area due to the intermediate transfer node junction 53. That is, the first gate 41 which is an access gate, and the second gate 42 which is a cell gate, are separately arranged in a plane, thereby increasing the cell area due to such a planar structure. Therefore, it is difficult to reduce the cell area using this method.

SUMMARY

Embodiments relate to semiconductor devices and, more particularly, to a method of manufacturing a split gate-type flash Electrically Erasable Programmable Read-Only Memory (EEPROM) device having a self-aligned Silicon-Oxide-Nitride-Oxide-Silicon (SONOS) structure.

Embodiments relate to a method of manufacturing an EEPROM device which can reduce the cell area.

In accordance with embodiments, there is provided a method including forming a mask pattern over a semiconductor substrate; forming a gate oxide layer over a top of the semiconductor substrate exposed through the mask pattern; forming access gates which are self-aligned with both side walls of the mask pattern, over a top of the gate oxide layer; removing the mask pattern; forming first dielectric spacers to be attached to side walls of the access gates; forming an insulating layer adapted to cover the access gates and the first dielectric spacers; and forming two cell gates, which are self-aligned with opposite side walls of the two access gates, respectively, each first dielectric spacer being interposed between a corresponding cell gate and a corresponding access gate, the cell gates separately arranged over a top of the insulating layer.

The method may further include, after forming the two cell gates, selectively removing an exposed portion of the insulating layer using the cell gates as an etching mask.

The method may further include, after selectively removing the exposed portion of the insulating layer, forming source and drain junctions and an intermediate transfer node junction on portions of the semiconductor substrate which are exposed through the access gates and the cell gates, through ion implantation.

The mask pattern may be formed to include two distinct dielectric layers.

The forming of the access gates may further include forming an access gate layer to cover the mask pattern; forming a second spacer layer over a top of the access gate layer; and etching back the second spacer layer and the access gate layer.

The forming the cell gates may include forming a cell gate layer; forming a third spacer layer over a top of the cell gate layer; and etching back the third spacer layer and the cell gate layer.

The insulating layer may be an Oxide-Nitride-Oxide (ONO) layer.

Accordingly, the embodiments illustrate the method of manufacturing an EEPROM device, which can reduce the cell area.

DETAILED DESCRIPTION

Figure 1:
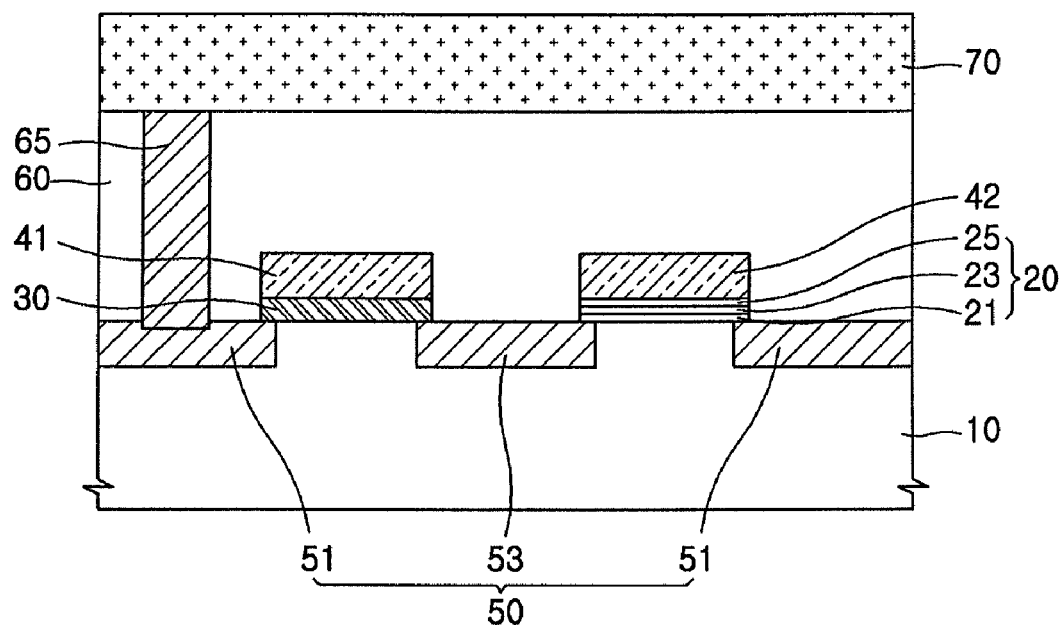
FIG. 1 is a sectional view schematically showing a method of manufacturing an EEPROM device; and Example
Figure 2:
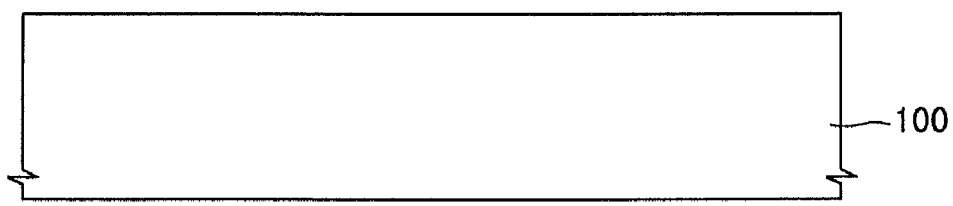
FIGS. 2 to 8 are sectional views schematically showing an EEPROM device according to embodiments.

Referring to FIG. 2, a semiconductor substrate 100 is prepared, and a Shallow Trench Isolation (STI) region is formed. Thereafter, a well process and a photo process and an ion implantation process for adjusting the threshold voltage $V_{th}$ of a cell are performed.

Figure 3:
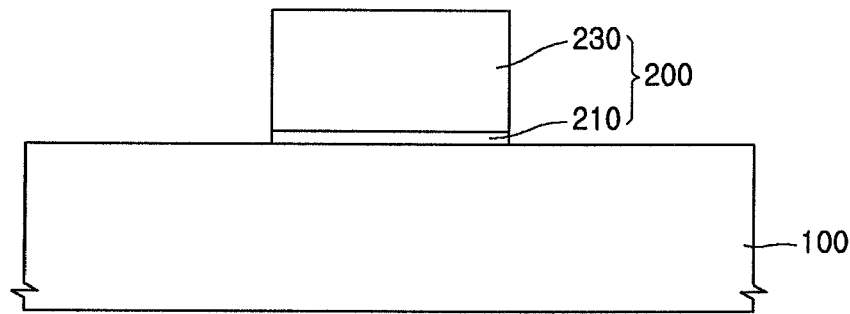

Referring to FIG. 3, a mask pattern 200 needed for a self-aligned gate is formed. More specifically, a first mask layer 210 and a second mask layer 230 are formed by sequentially depositing first and second dielectric layers made of different insulating materials. Thereafter, the mask layers are patterned through a photoetching process to form the mask pattern 200.

Figure 4:
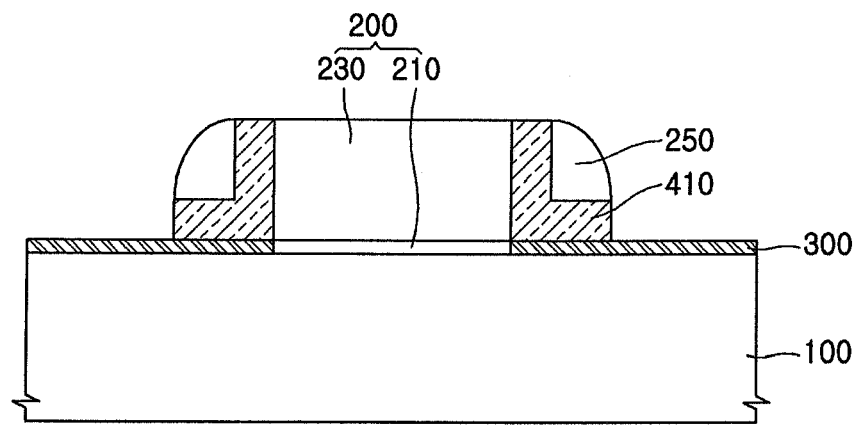

Referring to FIG. 4, a silicon oxide layer is grown over portions of the semiconductor substrate 100 which are exposed on both sides of the mask pattern 200 to form gate oxide layers 300. Thereafter, a layer for first gates 410, which are the access gates, for example, a conductive polysilicon layer, is deposited over the top of each gate oxide layer 300, and a first spacer layer is formed over the top of the layer for the first gates 410.

Next, spacer etching, for example, anisotropic dry etching, is performed to form first spacers 250. The exposed layer for the first gates 410 is etched through anisotropic dry etching, that is, is etched back, using the first spacers 250 as an etching mask to form the first gates 410 which are the access gates. The line width of the first gates 410 is determined depending on the deposition thickness (or line width: Critical Dimension [CD]) of the first spacers 250.

Since the first gates 410 are formed to be self-aligned with the mask pattern 200 and the first spacers 250, the length and CD of the first gates 410 are controlled by the CD of the first spacers 250 and the deposition thickness of the layer for the first gates 410. Therefore, the CD of the first gates 410 can be delicately controlled by minutely controlling the deposition thickness of the first spacers 250 and the first gates 410, etc. Accordingly, a very narrow CD of the first gates 410 can be achieved.

Figure 5:
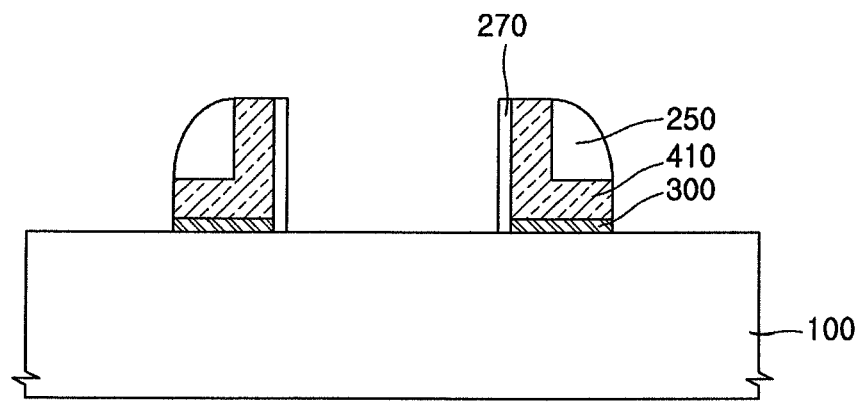
Figure 6:
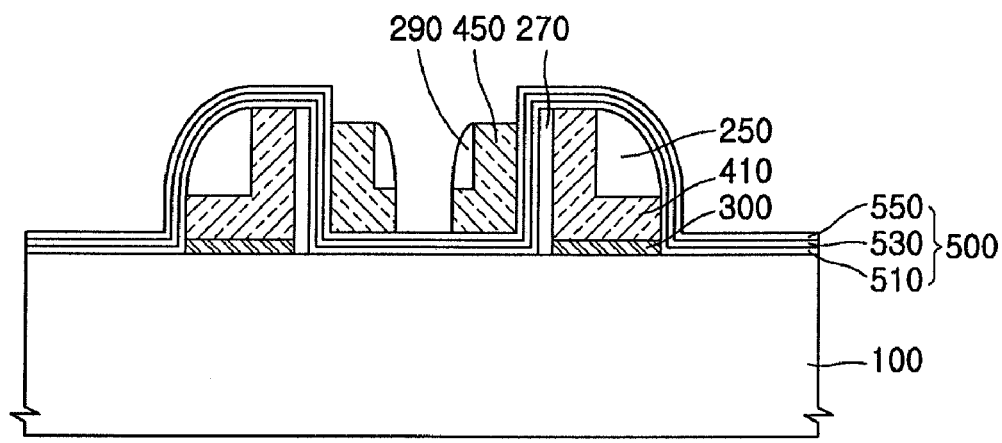

Referring to FIG. 5, the mask pattern 200 is selectively removed. Thereafter, second dielectric spacers 270 to be attached to the side walls of the first gates 410 are formed through a process for depositing a second dielectric spacer layer, and etching back the second spacer layer. Next, as shown in FIG. 6, an ONO layer 500 composed of oxide layer 510, nitride layer 530, and oxide layer 550 is formed over portions of the semiconductor substrate 100 exposed through the second spacers 270 and the first gates 410.

Thereafter, a layer for second gates 450, which are cell gates, for example, a conductive polysilicon layer, is deposited over the top of the ONO layer 500. The second gates 450, which are the cell gates separately arranged between the two first gates 410, separately formed over both side walls of the mask pattern 200, and which are required in order to open an intermediate region between the second gates 450, are formed.

More specifically, after the layer for the second gates 450 is deposited, a third spacer layer is formed over the top of the layer for the second gates 450. Next, an etch-back process including spacer etching, for example, anisotropic dry etching, is performed to form third spacers 290. Such a process for forming the third spacers 290 can be omitted.

The exposed layer for the second gates 450 is etched through anisotropic dry etching, that is, is etched back, using the third spacers 290 as an etching mask to form the second gates 450 which are the cell gates. The CD of the second gates 450 is determined depending on the deposition thickness (or Critical dimension [CD]) of the third spacers 290.

Since the second gates 450 are formed to be self-aligned with the first gates 410 and the third spacers 290, the length and CD of the second gates 450 are controlled by the CD (or deposition thickness) of the third spacers 290, or the deposition thickness of the layer for the second gates 450. Therefore, the CD of the second gates 450 can be delicately controlled by minutely controlling the deposition thickness of the third spacers 290 and the layer for the second gates 450, etc. Accordingly, a very narrow CD of the second gates 450 can be achieved.

In the above process, the third spacers 290 can be omitted.

Figure 7:
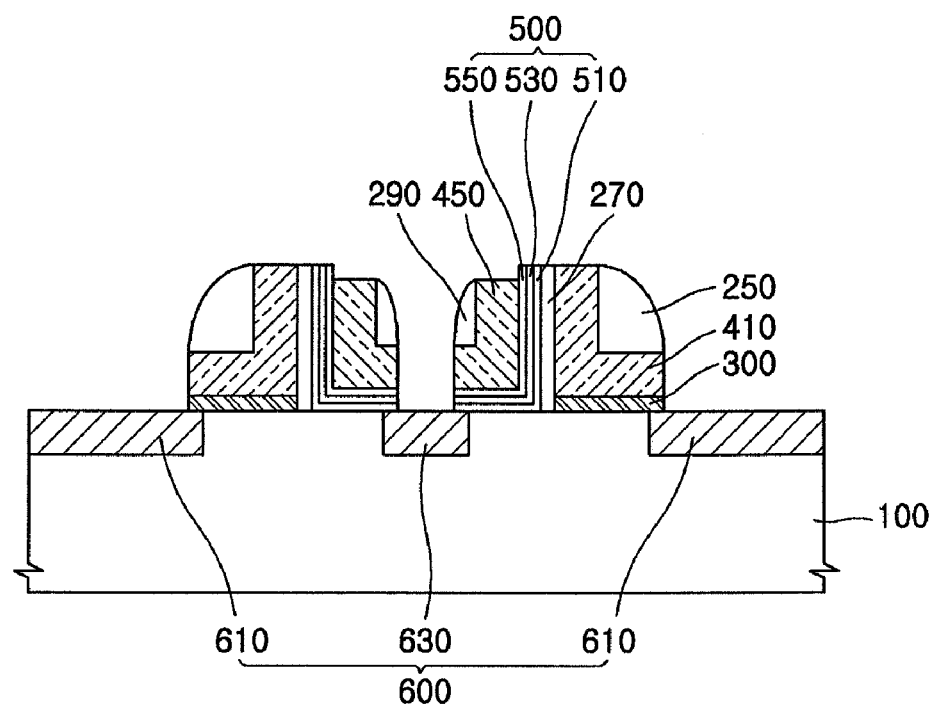

Referring to FIG. 7, the underlying ONO layer 500, which is exposed through the third spacers 290 and the first and second gates 410 and 450, is etched back to expose the portion of the underlying semiconductor substrate 100.

Figure 8:
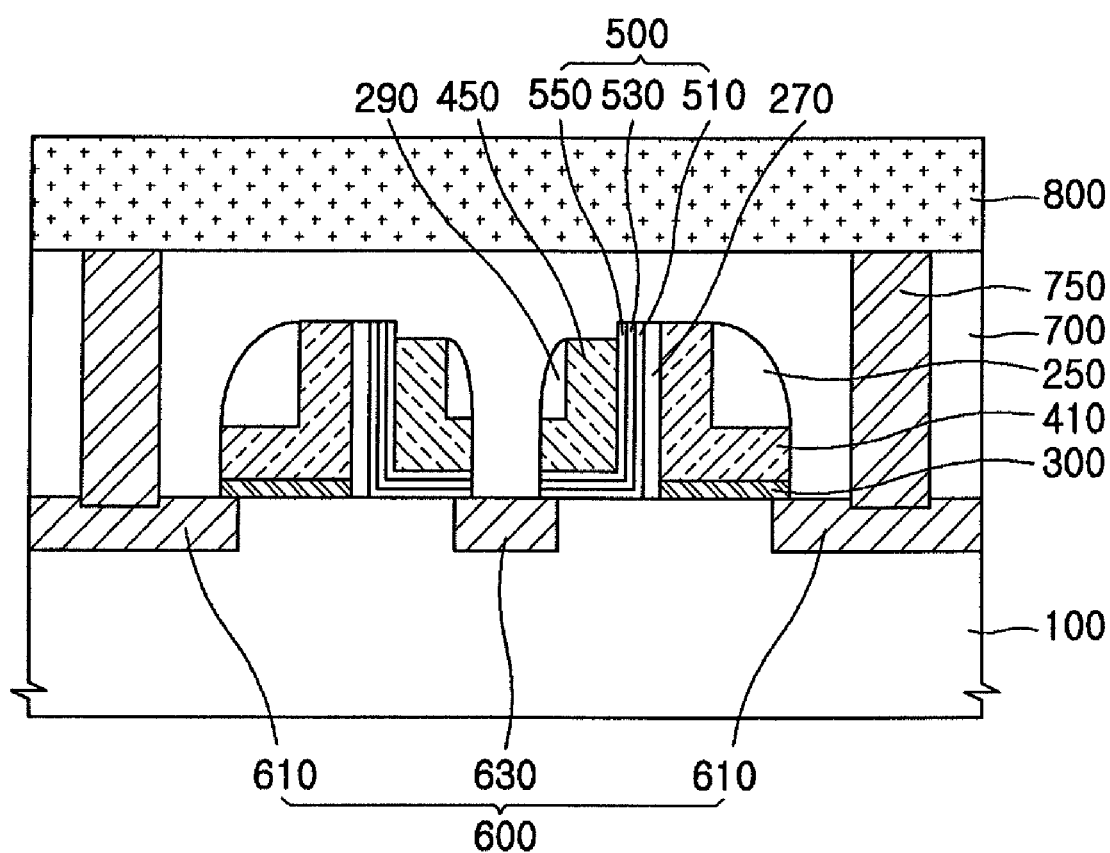

Referring to FIG. 8, after a reoxidation process is performed, junctions 600, such as source/drain junctions 610 and an intermediate transfer node junction 630, are formed through an ion implantation process. After an interlayer dielectric 700 is formed, contacts 750 penetrating through the interlayer dielectric 700, and a wire 800 connected to the contacts 750, for example, a bit line, are formed.

As described above, the first gates 410 which are access gates 410 can be patterned in a self-aligned manner to guarantee stable control of the length and CD. Since the width of the intermediate transfer node junction 630 can be appropriately adjusted by controlling the thickness of the second spacers 270, degradation that may occur during a cell operation can be prevented.

As described above, self-aligned access gates and cell gates are formed, so that the cell area can be minimized while the occurrence of over erase is prevented. Accordingly, limitation on the cell size which is imposed in using a SONOS cell can be eliminated so that the SONOS cell can be applied to various products.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method comprising:
   forming a mask pattern over a semiconductor substrate;
   forming a gate oxide layer over a top of the semiconductor substrate exposed through the mask pattern;
   forming access gates which are self-aligned with both side walls of the mask pattern, over a top of the gate oxide layer;
   removing the mask pattern;
   forming first dielectric spacers to be attached to side walls of the access gates;
   forming an insulating layer adapted to cover the access gates and the first dielectric spacers; and
   forming two cell gates, which are self-aligned with opposite side walls of the two access gates, respectively, each first dielectric spacer being interposed between a corresponding cell gate and a corresponding access gate, said cell gates separately arranged over a top of the insulating layer.

2. The method of claim 1, wherein the method further comprises, after forming the two cell gates, selectively removing an exposed portion of the insulating layer using the cell gates as an etching mask.

3. The method of claim 2, wherein the method further comprises, after selectively removing the exposed portion of the insulating layer, forming source and drain junctions and an intermediate transfer node junction on portions of the semiconductor substrate which are exposed through the access gates and the cell gates, through ion implantation.

4. The method of claim 1, wherein the mask pattern is formed to include two distinct dielectric layers.

5. The method of claim 1, wherein the forming the access gates comprises:
   forming an access gate layer to cover the mask pattern;
   forming a second spacer layer over a top of the access gate layer; and
   etching back the second spacer layer and the access gate layer.

6. The method of claim 1, wherein the forming the cell gates comprises:
   forming a cell gate layer;
   forming a third spacer layer over a top of the cell gate layer; and
   etching back the third spacer layer and the cell gate layer.

7. The method of claim 1, wherein the insulating layer is an Oxide-Nitride-Oxide (ONO) layer.

8. The method of claim 1, wherein the method is a method of manufacturing an Electrically Erasable Programmable Read-Only Memory (EEPROM) device.

* * * * *